United States Patent [19]
Blette et al.

[11] Patent Number: 5,186,982
[45] Date of Patent: Feb. 16, 1993

[54] PIN TRANSFER APPLICATOR AND METHOD

[75] Inventors: Russell E. Blette, Hastings, Minn.; John O. Roeser, Barrington, Ill.

[73] Assignee: Minnesota Mining and Manufacturing Company, St. Paul, Minn.

[21] Appl. No.: 584,356

[22] Filed: Sep. 18, 1990

[51] Int. Cl.$^5$ .................. B05D 5/00; B05D 1/26; B05C 1/02
[52] U.S. Cl. ..................... 427/256; 427/96; 118/243; 118/263; 118/697; 901/43
[58] Field of Search ............ 118/243, 263, 697; 427/96, 256; 901/43

[56] References Cited

U.S. PATENT DOCUMENTS

| | | | |
|---|---|---|---|
| 4,110,591 | 8/1978 | Trinchera | 219/85 CA |
| 4,159,079 | 6/1979 | Phillips, Jr. | 239/112 |
| 4,332,335 | 6/1982 | Fiorentini | 222/145 |
| 4,452,917 | 6/1984 | Proksa et al. | 521/50 |
| 4,646,676 | 3/1987 | Kidder et al. | 118/243 |
| 4,695,482 | 9/1987 | Weiswurm | 427/96 |

Primary Examiner—Evan Lawrence
Attorney, Agent, or Firm—Gary L. Griswold; Walter N. Kirn; James D. Christoff

[57] ABSTRACT

A method and an assembly useful for dispensing small quantities of liquid materials onto a workpiece. The assembly includes an applicator having a pin movable along a passageway from a retracted position to an extended position. As the pin moves to the extended position, a forward end of the pin picks up a small dot of the liquid materials and carries the dot to a position external of a housing of the applicator and into contact with a selected location on the workpiece. As the pin is retracted, a portion of the dot remains on the selected location and detaches from the pin. The assembly is particularly useful for dispensing small dots of solder paste at relatively high speeds in automated fashion at selected locations on a circuit board.

17 Claims, 3 Drawing Sheets

PIN TRANSFER APPLICATOR AND METHOD

BACKGROUND OF THE INVENTION

1. Field of the Invention

This invention relates to a pin transfer applicator assembly for depositing small dots of liquid materials onto a workpiece.

2. Description of the Related Art for applying small dots of liquid materials onto a workpiece. For example, automated devices for assembling printed circuit boards may include an applicator for placing small dots of liquid solder (which may be in the form of a heavy paste) onto leads of integrated circuits or other solid state devices at locations where the leads pass through the traces or interconnects of the circuit board. Once the dots of solder are in place, the dots are subjected to heat and melted so that when cooled the solder mechanically and electrically connects the leads to the traces.

Certain automated solder dot applicators include a reservoir for holding liquid solder, and a tube or needle for directing the solder to the workpiece. If desired, the needle may be mounted on a movable arm of a programmable 3-axis robotic machine such as the 3M Otto A9 system sold by the assignee of the present invention. The machine may be programmed to move the arm to different positions in order to place small dots of solder or other materials onto multiple, pre-selected locations on the workpiece.

In the past, liquid solder has often been dispensed by automated systems by use of pressurized air which is applied to the solder reservoir in order to urge the solder to flow from the reservoir and through the elongated, slender dispensing needle. However, the small passageways of such needles may occasionally clog from particles of solder, particularly when the solder is in the form of a heavy paste or suspension. Furthermore, there is often a delay from the time that pressure is applied to the reservoir and the time that the solder is discharged from the outlet of the needle, and as a consequence such systems are not entirely satisfactory for high speed operations.

Another known type of solder dot applicator is often referred to as a pin transfer applicator and includes a number of parallel, vertical pins which depend from a movable frame. The pins are arranged in an array that correlates to multiple, spaced apart locations on the circuit board. In use, the frame is first moved toward a tray containing liquid solder, and the ends of the pins are simultaneously dipped in the solder and then retracted, causing a small dot of solder to adhere to the end of each pin. Next, the frame is moved toward the circuit board, and ends of the pins advance toward corresponding, pre-selected locations on the circuit board until simultaneous contact is established between each dot of solder and the respective location on the circuit board. Finally, the frame is moved away from the circuit board, whereupon the dots of solder are transferred from the pins to the circuit board.

However, the aforementioned pin transfer applicator is somewhat unsatisfactory in that the configuration of the pin array is fixed and must be manually changed to accommodate different types of circuit boards. In addition, such a device is not entirely suitable for some high speed assembly operations because of the time necessary to move the frame supporting the pins between the tray and the circuit board.

SUMMARY OF THE INVENTION

The present invention concerns a pin transfer applicator assembly for dispensing liquid materials, and includes an applicator having a passageway. The passageway has an inlet for admitting a quantity of liquid materials to be dispensed, and the passageway also has an outlet remote from the inlet. The applicator includes a pin and means for selectively moving the pin relative to the passageway and toward an extended position in order to direct the quantity of liquid materials in the passageway through the outlet. The assembly further includes a support for supporting a workpiece, and means for moving the applicator relative to the support along a path for bringing the pin when in the extended position to a location closely adjacent the workpiece, such that at least a portion of the quantity of liquid materials is transferred from the pin to the workpiece.

The applicator assembly is especially useful for applying small dots of solder onto a circuit board at relatively high speed, since the movable pin forceably displaces the solder and movement of the solder through the passageway is not limited to the forces of air pressure. If desired, the applicator may be mounted onto a movable arm of a 3-axis programmable robotic system for automated dispensing. As another alternative, a number of similar applicators may be placed in a stationary row across a moving conveyer, and the applicators may be individually or simultaneously actuated in order to apply dots of solder onto particular locations of the circuit board as the conveyer advances the board.

DETAILED DESCRIPTION OF THE PREFERRED EMBODIMENT

Figure 1:
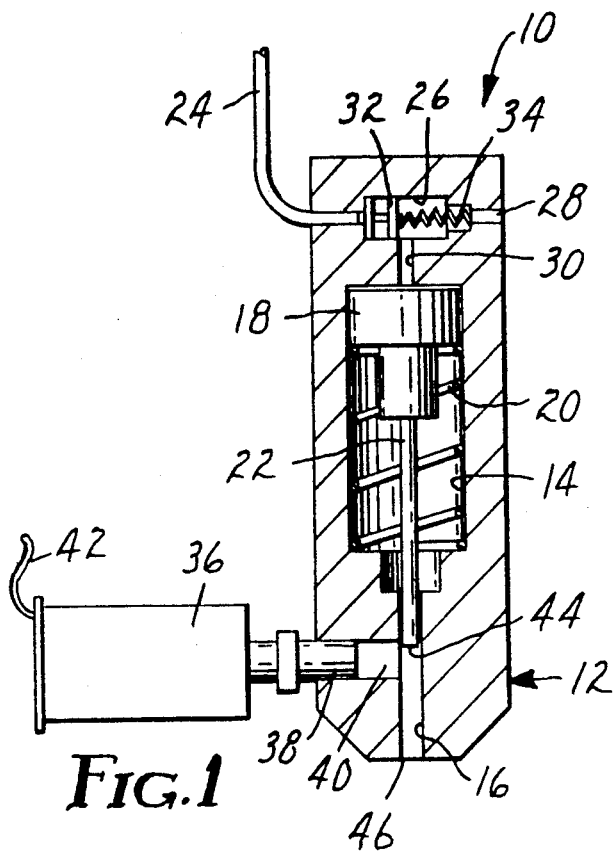
FIG. 1 is a side cross-sectional view of an applicator of the assembly according to the invention.
Figure 2:
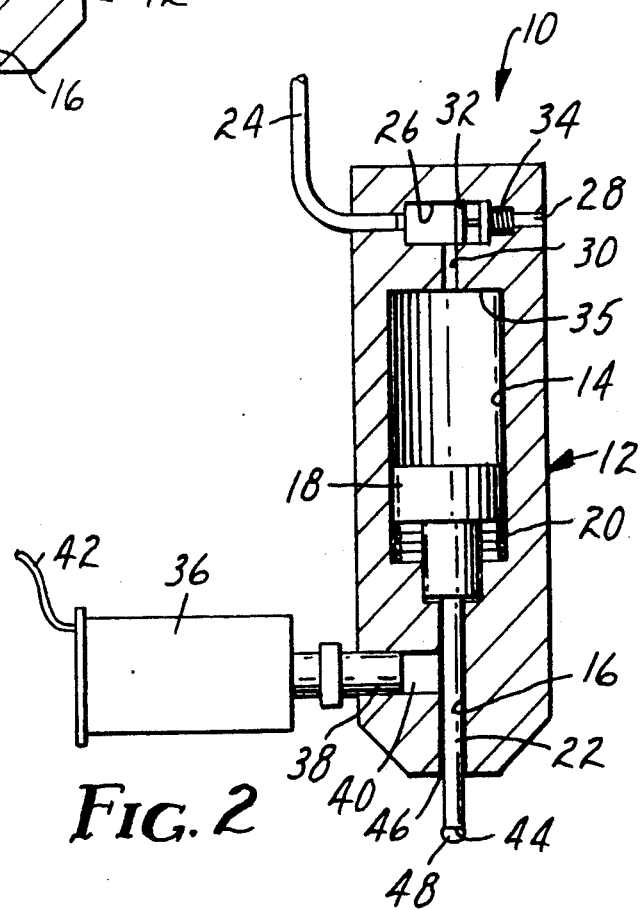
FIG. 2 is a view somewhat similar to FIG. 1 except that a pin of the applicator has been moved to an extended position.

Viewing FIGS. 1 and 2, a pin transfer applicator 10 includes a housing 12 formed with a chamber 14, and an elongated cylindrical passageway 16 leads from the chamber 14 to one end of the housing 12. A piston 18 is received in the chamber 14 and is biased in a direction away from the passageway 16 by a coiled compression spring 20. An elongated, solid, cylindrical pin 22 is affixed to a forward end of the piston 18, and a portion of the pin 22 is complementally received in the passageway 16 for sliding, reciprocating movement along the longitudinal axis of the latter.

A length of tubing 24 is connected to a control valve (not shown) which is selectively actuable to communicate the tubing 24 with a source of pressurized air. The tubing 24 leads to a valve compartment 26 formed in the housing 12. The valve compartment 26 communicates with the atmosphere by means of a vent 28, and also communicates with the chamber 14 by means of a passage 30.

A piston valve 32 is slidably received in the complementally-shaped compartment 26, and is biased to the left viewing FIGS. 1 and 2 by means of a coiled compression spring 34. When pressurized air is introduced into the tubing 24, the valve 32 moves from the position shown in FIG. 1 to the position shown in FIG. 2 against the bias presented by the spring 34 and closes the vent 28, and as a result the pressurized air from tubing 24 is directed through the passage 30 and into the chamber 14 where it bears against the rear face of the piston 18. The piston 18 along with the attached pin 22 then moves from a retracted position as shown in FIG. 1 to an extended position as shown in FIG. 2 against the bias of the spring 20.

Once the air pressure within the tubing 24 is relieved by the external control valve, the spring 34 pushes the valve 32 from the position shown in FIG. 2 to the position shown in FIG. 1, thereby also relieving the pressure of air within the chamber 18 by communicating the passage 30 with the vent 28. At such time, the spring 20 urges the piston 18 and the pin 22 attached therewith from the extended position shown in FIG. 2 and to the retracted position shown in FIG. 1, where the rear face of the piston 18 comes to a stop against the facing wall portion 35 of the chamber 14. An adjustable stop for the piston 18 may optionally be provided (on either side thereof), and an adjustment to vary the location of the pin 22 relative to the piston 18 may also be provided.

A reservoir 36 for holding a quantity of liquid materials is connected to a conduit 38 that is, in turn, in communication with an inlet 40 of the passageway 16. The reservoir 36 is connected to a source of pressurized air by means of a tube 42. When the piston 18 is in its retracted position as shown in FIG. 1, the pressure of air within the reservoir 36 directs liquid materials therein through the conduit 38 and the inlet 40, and to a position within the passageway 16 directly in front of a forward end 44 of the pin 22.

As pressurized air enters the tubing 24 to open the valve 32 and initiate movement of the piston 18 toward its extended position, the forward end 44 of the pin 22 pushes the liquid materials in the passageway 16 through a passageway outlet 46 formed in the forward end of the housing 12. Furthermore, as the forward end 44 advances past the inlet 40, the pin 22, being complemental in diameter to the diameter of the passageway 16, closes the inlet 40 and substantially prevents the entrance of additional liquid materials into the passageway 16. As the piston 18 and pin 22 move to their extended positions as shown in FIG. 2, the relatively small quantity or dot 48 of liquid materials previously within the passageway 16 is pushed through the outlet 46 by the forward end 44, and remains in attachment with the forward end 44 until deposited on a workpiece or other object as will be explained below. Subsequent relief of pressure within the tubing 24 and the accompanied movement of the pin 22 to its retracted position opens the inlet 40 and enables another quantity of liquid materials to flow from the reservoir 36 and into the passageway 16.

The wall portion 35 provides a positive stop to rearward movement of the piston 18, and consequently the forward end 44 comes to rest at the same location above the inlet 40 each time that the pin 22 is moved to its retracted position. As a result, the volume of liquid materials entering the passageway 16 is essentially the same during each cycle or reciprocation of the pin 22 so that the size or volume of the dot 48 remains consistent from one cycle to the next. If desired, the thickness of the piston 18 or the location of the wall portion 35 may be changed to vary the volume of the dot 48. Furthermore, the amount of time that pin 22 is above the inlet 40 (viewing FIG. 1) may determine in part the amount of liquid materials deposited in the passageway 16 during each stroke of the pin 22 in operating conditions where the liquid materials are still entering the passageway 16 at the time that the pin 22 closes the inlet 40 during its advancement stroke.

The pressure within the reservoir 36 is great enough to cause the liquid materials therein to readily flow through the conduit 38 and into the passageway 16 when the pin 22 is retracted, but yet not great enough to cause the liquid materials to continue to flow out of the passageway 16 without mechanical assistance from the pin 22. In this regard, the pressure within the reservoir 36 is selected in accordance with the diameter of the passageway 16 and the viscosity of the liquid materials (which could include thick pastes or suspensions including conventional solder pastes). As one example, the pressure within the reservoir 36 may be 50-60 psi when liquid solder having a viscosity of 400,000 centipoise is used and contained in the reservoir 36, and when the passageway 16 has a diameter of 0.014 inches. Pressure in the reservoir 36 is continuous and need not be interrupted or varied during cycling of the pin 22, since the pin 22 closes the inlet 40 as it moves therepast. Moreover, the cross-sectional area of the conduit 38 is large enough to substantially prevent clogging that might otherwise occur with the use of conduits of somewhat smaller area.

Figure 4:
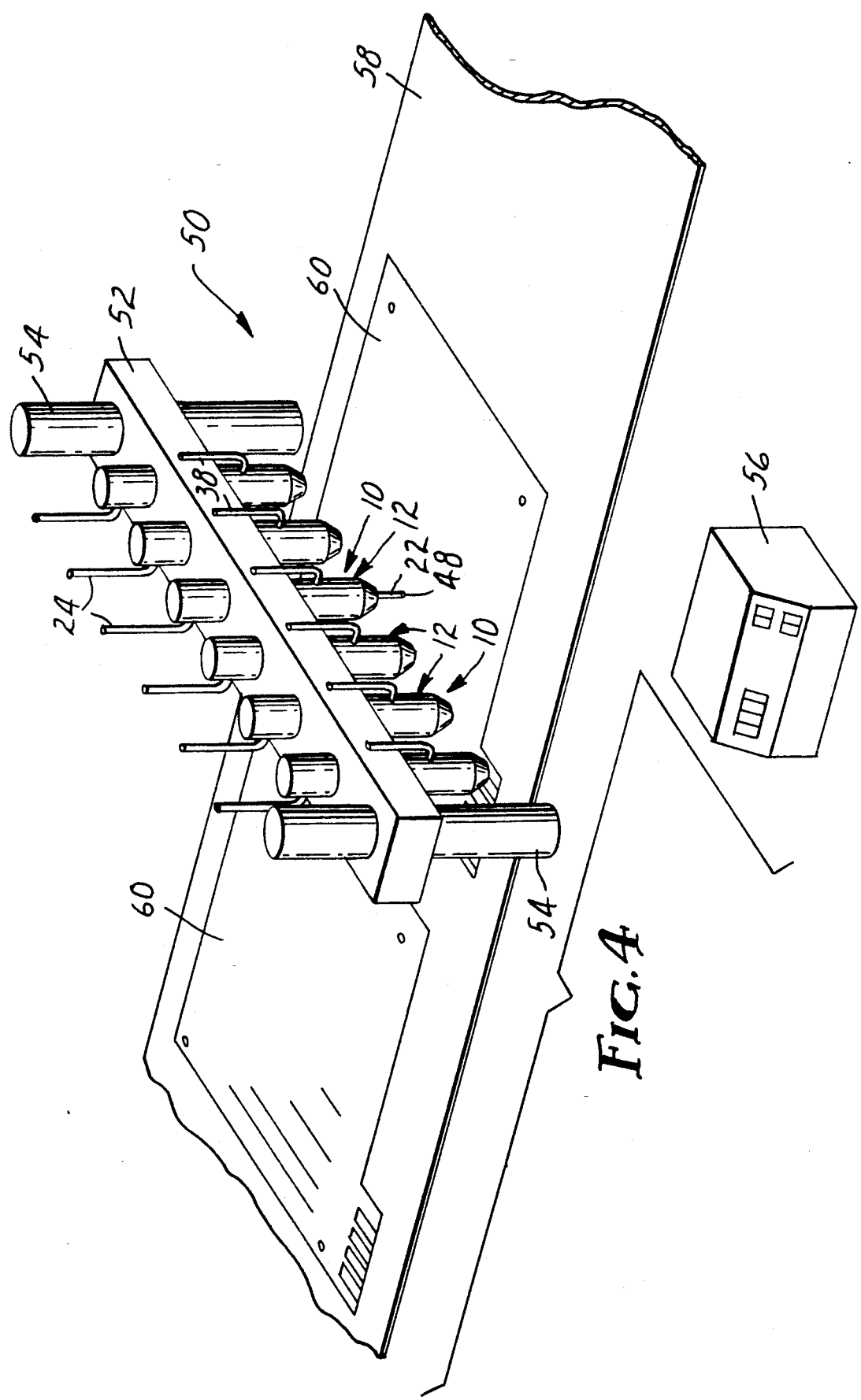
FIG. 4 is a reduced, perspective, schematic, fragmentary view of an automated applicator assembly in accordance with one embodiment of the invention, depicting a row of applicators, each of which is somewhat similar to that shown in FIGS. 1 and 2.

Referring now to FIG. 4, a pin transfer applicator assembly 50 is shown and includes a plurality of applicators 10 mounted in a row on a horizontal beam 52 that is supported on each end by upstanding legs 54. In this instance, however, the conduit 38 of each applicator 10 is connected to a manifold (not shown) that is, in turn, coupled to a common, pressurized liquid materials reservoir similar to the reservoir 36 shown in FIGS. 1 and 2. The tubing 24 leading from each applicator 10 is connected to separate, electrically actuated air valves (not shown) that are selectively opened or closed by means of a programmable control system 56.

A conveyer belt 58 comprises a support for supporting a workpiece such as a circuit board 60. Advantageously, a number of circuit boards 60 are placed in spaced apart fashion along the length of the belt 58. The control system 56 is operable to move the belt 58 in longitudinal, stepwise fashion in the direction of the arrow. Thus, selected locations on the circuit board 60 may be advanced by the belt 58 by means of the control system 56 to a position directly beneath the row of applicators 10.

The control system 56 may be programmed to actuate one or more of the applicators 10 as soon as selected location(s) are beneath the pins 22 of the applicators 10. Upon actuation of any applicator 10, the forward end 44 of the respective pin 22 moves to a position closely spaced from the desired location therebeneath on the circuit board 56, so that the dot 48 (FIG. 2) of liquid materials (in this instance, solder pasts) on the forward end 44 touches the selected location on the circuit board 60. Next, as the pin 22 is retracted, the portion of dot 48 remains on the selected location and pulls apart from a remaining portion of the dot 48 which remains on the forward end 44.

Figure 3:
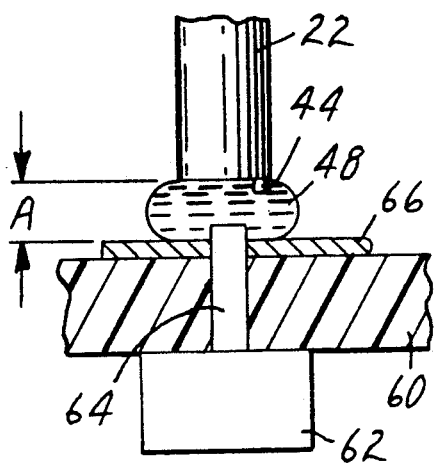
FIG. 3 is an enlarged, fragmentary, cross-sectional view of the pin of FIGS. 1-2 when moved into close proximity with a circuit board for transferring a dot of solder to the circuit board.

FIG. 3 shows in exemplary detail the circuit board 60 and transfer of the dot 48 thereto. An electrical component 62 has a lead 64 that extends through a hole formed in the board 60. The lead 64 also passes through a hole in a circuit interconnect or trace 66 that is located on a side of the circuit board opposite the major portion of the component 62. The forward end of the pin 44 is moved toward the lead 64 on the same side of the board 60 as the trace 66, so that the dot 48 is placed over the end of the lead 64 and surrounds the latter as well as contacting adjacent portions of the trace 66. In practice, the forward end 44 should be advanced sufficiently close to the board 60 such that the gap A in FIG. 3 between the forward end 44 and the top surface of the trace 66 is less than the vertical dimension (viewing FIG. 3) of the dot 48 before the dot 48 comes into contact with the trace 66.

As the pin 22 is retracted, part of the dot 48 will adhere to the forward end 44, and another part of the dot 48 will adhere to the trace board 60. As the pin 22 continues to retract, the forces of adhesive attraction between the solder and the end 44 as well as the board 60 will exceed the internal cohesive forces of the solder itself, likely causing the dot to separate into two portions, one of which adhere to the forward end 44 and the other of which will adhere to the board 60. The phenomena of deposition of the portion of the solder dot 48 on the board 60 is not fully understood, but may be related to the principles of capillary attraction or surface energy phenomena, physical attraction, chemical attraction or a combination of such.

In practice, the applicators may be fired at very high speeds in timed relationship to stepwise movement of the conveyer belt 58 so that, for instance, solder may be directly applied to leads of integrated circuits previously placed on the circuit board 60 at locations where the leads pass through traces of the board 60. Moreover, and as is represented in FIG. 4, the control system 56 may be programmed so that only a certain number of the applicators 10 are actuated in any one longitudinal position of the belt 58 in correspondence with the positions of selected locations on the circuit board 60. If desired, the beam 52 may be placed at an angle other than 90 degrees relative to the conveyer belt 58 in order to decrease the effective spacing of the applicators 10 across the transverse width of the belt 58, so that closely spaced apart locations on the boards 60 may each receive separate dots of solder as desired without the necessity of miniaturizing each applicator 10.

Figure 5:
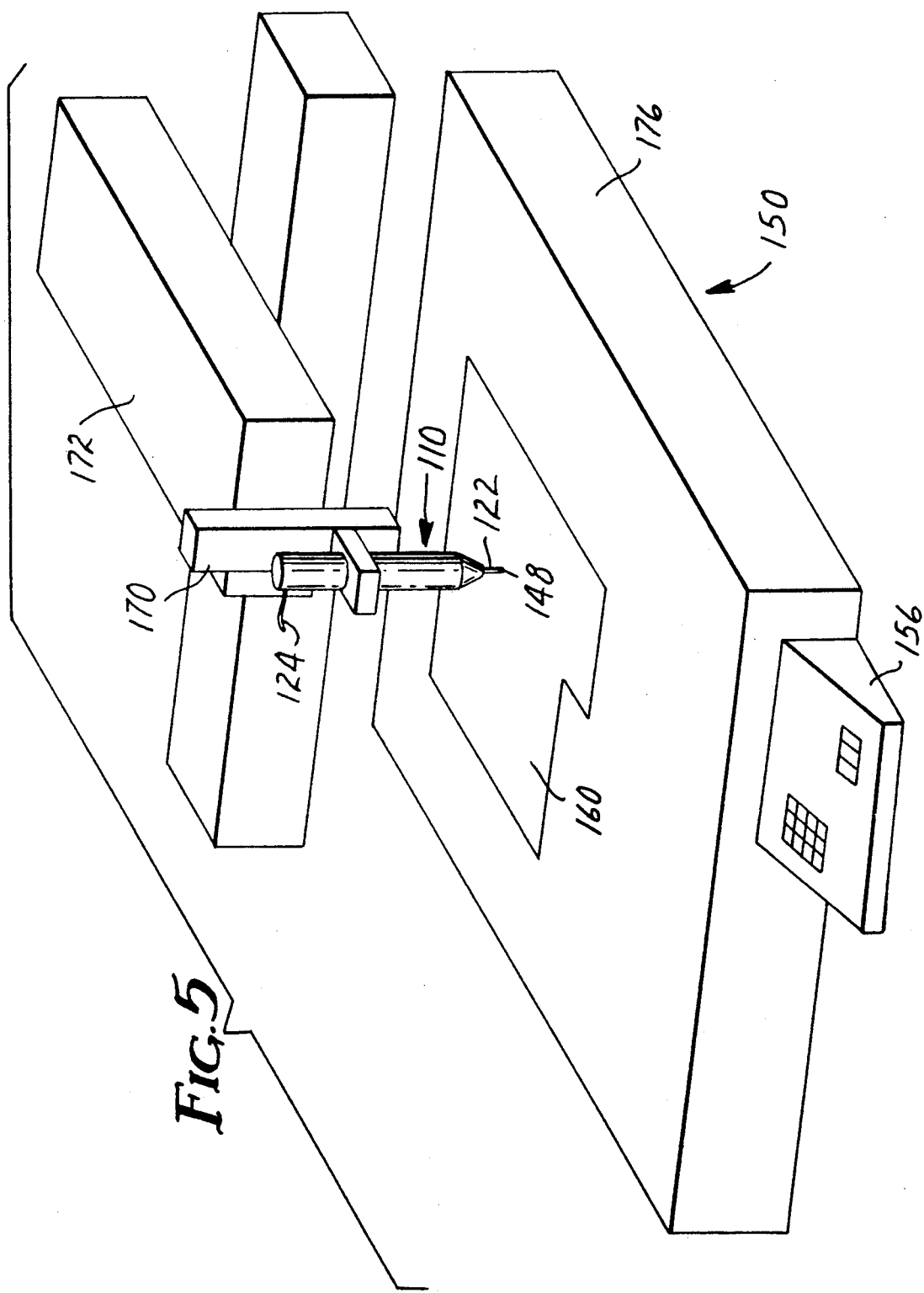
FIG. 5 is a perspective, schematic view of an automated applicator assembly in accordance with another embodiment of the invention.

A pin transfer applicator assembly 150 according to another embodiment of the invention is shown schematically in FIG. 5, and includes an applicator 110 essentially identical to the applicator 10 shown in FIGS. 1 and 2. The applicator 110 is mounted on a bracket 170 movable in a vertical direction, and the bracket 170 is carried on one end of an arm 172 that is movable in a horizontal direction. In turn, the arm 172 is shiftably mounted on a beam 174 that is movable in a horizontal direction perpendicular to the direction of movement of the arm 172.

Individual, selective movement of the bracket 170, the arm 172 and the beam 174 is controlled by respective step motors (not shown) for precise motion along one or more of three mutually perpendicular reference axes. A control system 156 may be programmed to selectively energize the motors controlling movement of the bracket 170, the arm 172 and the beam 174 so that the applicator 110 shifts from one desired position to another corresponding to selected, spaced-apart locations on a circuit board 160. A table 176 comprises a support for supporting the circuit board 160.

In use, the control system 156 is programmed to bring a forward end of a pin 122 of the applicator 110 directly above desired locations on the circuit board 160 in sequential fashion. Once the applicator 110 is moved to a position above any one location, the control system 156 then opens an air valve to admit pressurized air into tubing 124 which ultimately causes the forward end of the pin 122 to extend to a position spaced closely above the desired site. At that time, a small dot 148 of solder, previously attached to a forward end of the pin 122 comes into contact with the circuit board 160 and a portion of the dot 148 is deposited on the board 160 as the pin 122 moves away from the board 160 toward a retracted position. The control system 156 then moves the applicator 110 to another position spaced above a desired location on the circuit board 160, and the aforementioned deposition process is repeated until each desired site on the circuit board 160 receives a dot of solder paste.

We claim:

1. A pin transfer applicator assembly for dispensing liquid materials comprising:
   an applicator having a passageway with an inlet for admitting a quantity of liquid materials to be dispensed, said passageway having an outlet remote from said inlet, said applicator including a pin in said passageway and means for selectively moving said pin relative to said passageway past said inlet and toward an extended position in order to direct said quantity of liquid materials in said passageway through said outlet;
   a support for supporting a workpiece; and
   means for moving said applicator relative to said support along a path for bringing said pin when in said extended position to a location closely adjacent said workpiece such that at least a portion of said quantity of liquid materials is transferred from said pin to said workpiece, said means for moving said pin including means for moving said pin relative to said passageway along a path and in a single continuous motion that directs said quantity of liquid materials past said inlet, through said outlet and onto said workpiece.

2. The assembly of claim 1; and further including a reservoir for holding liquid materials to be dispensed, a conduit interconnecting said reservoir and said inlet of said passageway, and a means for pressurizing said reservoir in order to urge liquid materials toward said inlet of said passageway.

3. The assembly of claim 1, wherein said means for moving said pin includes a piston movable in response to pressurized fluid, and wherein said pin is connected to said piston.

4. The assembly of claim 1, wherein said pin has a configuration complemental to said passageway.

5. The assembly of claim 4, wherein said pin has a forward end movable past said inlet and said pin substantially closes said inlet as said forward end of said pin moves past said inlet.

6. The assembly of claim 1, wherein said support comprises a conveyer belt, and wherein said means for moving said applicator relative to said support comprises a control system for controlling the movement of said belt relative to said applicator.

7. The assembly of claim 6, wherein said control system is programmable.

8. The assembly of claim 1, wherein said support comprises a stationary table; and including an arm movable relative to said table, wherein said applicator is connected to said arm.

9. The assembly of claim 8, wherein said means for moving said applicator relative to said support comprises a programmable control system for controlling the movement of said arm.

10. The assembly of claim 1, wherein said means for moving said applicator relative to said support comprises an automated, programmable robotic arm.

11. The assembly of claim 3, wherein said applicator further includes a valve for controlling the flow of pressurized fluid for moving said piston, and wherein said applicator includes a spring for closing said valve and relieving the pressure of the fluid.

12. A pin transfer applicator assembly for dispensing liquid materials comprising:
   an applicator having a passageway with an inlet for admitting a quantity of liquid materials to be dispensed, said passageway having an outlet remote from said inlet, said applicator including a pin and means for selectively moving said pin relative to said passageway and toward an extended position in order to direct said quantity of liquid materials in said passageway through said outlet;
   a support for supporting a workpiece; and
   means for moving said applicator relative to said support along a path for brining said pin when in said extended position to a location closely adjacent said workpiece such that at least a portion of said quantity of liquid materials is transferred from pin to said workpiece, wherein said means for moving said pin includes a piston movable in response to pressurized fluid, and wherein said pin is connected to said piston, and wherein said applicator includes a spring for biasing said piston away from said passageway.

13. A method for dispensing liquid materials comprising:
   directing a quantity of liquid materials into a passageway having an outlet;
   shifting said outlet relative to a workpiece along a path such that said outlet is adjacent a selected location on said workpiece;
   moving an elongated pin along said passageway and to an extended position in a single continuous motion relative to said passageway wherein said single motion directs at least a portion of said quantity of liquid materials past said inlet, through said outlet and onto said selected location on said workpiece.

14. The method of claim 13, wherein said step of transferring said quantity of liquid materials from said pin to said selected location further includes retracting said pin away from said selected location whereby leaving said portion of said liquid materials on said envelope.

15. The method of claim 13, wherein said step of directing said quantity of liquid materials into a passageway includes the step of pressurizing a reservoir of liquid materials in order to urge said liquid materials from said reservoir and into said passageway.

16. The method of claim 13, wherein said step of shifting said outlet relative to said workpiece includes the step of moving a robotic arm carrying said outlet to a selected position.

17. The method of claim 13, wherein said step of shifting said outlet relative to said workpiece includes the steps of supporting said workpiece on a conveyer belt and moving said conveyer belt as necessary to bring said selected location on said workpiece adjacent to said outlet.

* * * * *